United States Patent [19]

Nohara et al.

[11] Patent Number: 5,428,832
[45] Date of Patent: Jun. 27, 1995

[54] NOISE SUPPRESSION APPARATUS

[75] Inventors: Akira Nohara, Nishinomiya; Joji Kane, Nara, both of Japan

[73] Assignee: Matsushita Electric Industrial Co., Ltd., Osaka, Japan

[21] Appl. No.: 29,247

[22] Filed: Mar. 10, 1993

[30] Foreign Application Priority Data

Mar. 11, 1992 [JP] Japan .................................. 4-052544
Dec. 14, 1992 [JP] Japan .................................. 4-332619

[51] Int. Cl.6 ............................................. H04B 1/10
[52] U.S. Cl. ...................................... 455/296; 375/346
[58] Field of Search ............... 455/295, 296, 297, 299,
455/303, 306, 308, 309, 311, 312, 324, 212, 218,
220, 221, 222, 225; 375/99; 364/514; 328/162,
163, 165

[56] References Cited

U.S. PATENT DOCUMENTS

| | | | |
|---|---|---|---|
| 3,857,104 | 12/1974 | Sacks . | |
| 4,351,062 | 9/1982 | Yoshiya | 379/99 |
| 4,426,727 | 1/1984 | Hamada | 455/296 |
| 4,901,150 | 2/1990 | Klingelhofer et al. | 455/296 |
| 4,969,207 | 10/1990 | Sakamoto et al. | 455/303 |

FOREIGN PATENT DOCUMENTS 0449199 10/1991 European Pat. Off. .
0453213 10/1991 European Pat. Off. .
2929647 2/1981 Germany .

OTHER PUBLICATIONS

IEE Proceedings-G vol. 136, No. 5, Oct. 1989, Stevenage, Herts, GB, pp. 269-277, XP66014, Boussakta et al, 'Prime-factor Hartley and Hartley-like Transform Calculation Using Transversal Filter-type Structures'.

Primary Examiner—Reinhard J. Eisenzopf
Assistant Examiner—Thanh Le
Attorney, Agent, or Firm—Lowe, Price, LeBlanc & Becker

[57] ABSTRACT

A noise suppression apparatus comprising a tuner 1 which selectively receiving a radio wave signal to be received and transforming it into an electric signal, a field information detector 2 which detects electric field information of the radio wave signal received by the tuner 1, a noise data generator 6 which generates a noise pattern on the basis of the electric field information .detected by the field information detector 2, a noise canceler 4 which removes an noise component from the signal outputted from the tuner 1 on the basis of the noise pattern generated by the noise data generator 6, and an amplifier 7 which outputs a noiseless signal outputted from the noise canceler 4.

31 Claims, 19 Drawing Sheets

NOISE SUPPRESSION APPARATUS

BACKGROUND OF THE INVENTION

1. Field of the Invention

The present invention relates to a noise suppression apparatus used in radio wave communication and the like, and more particularly to a noise suppression apparatus used for a receiver.

2. Description of the Prior Art

Recently, the noise suppression using digital signal procession technology has been variously developed.

FIG. 20 is a circuit block diagram showing a conventional noise suppression apparatus. In FIG. 20, a reference numeral 20 represents a filter control section, and a reference numeral 52 represents a band pass filter group (abbreviated by BPF group). And a reference numeral 53 represents an adder. The filter control section 51 controls filter factors of the band pass filter group 52 in accordance with the noise level of sound input signal. The band pass filter group 52 includes a group of band path filters, which separates the sound input signal into a plurality of bands. The characteristics of each band bass filter in this band pass filter group 52 is determined in accordance with the control signal of the filter control section 51. The adder 53 adds output signals fed from these band pass filters of the band pass filter group 52 and produces a noiseless sound signal.

An operation of this conventional noise suppression apparatus is explained below.

An input signal, for example radio broadcasting sound signal containing noise, is inputted into the filter control section 51. The filter control section 51 judges what kind of noise components this input signal contains, and supplies the band pass filter group 52 the filter factors which cut these noise components. The band pass filter group 52 separates the input signal into a plurality of adequate band levels. Each band pass filter in the band pass filter group 52 responds to the filter factor supplied from the filter control section 51 to pass only the sound component of the input signal, and feeds it to the adder 53. The adder 53 adds the output signals of these band pass filters, so as to produces noiseless sound signal.

In accordance with such a conventional noise suppression apparatus no significant improvement is expected in the articulation, though some increase of the S/N ratio is found. Furthermore, it is recognized that a particular noise sound remains even after the noise Suppression is finished by this apparatus.

Moreover, the input signal may contain multipath noises. In order to suppress these multipath noises, there is known a method using a plurality of antennas. In this method, an antenna direction to receive radio waves is different from each other, so that the receiver can select the optimum antenna which is receiving the least multipath noise.

However, in the case where the multipath noise has once received by the receiver, this multipath noise was not removed by the signal processing. Because, the waveform of the radio wave is already distorted when received in the receiver.

SUMMARY OF THE INVENTION

Accordingly, the present invention has a purpose, in view of above-described problems or disadvantages, to provide a noise suppression apparatus capable of remarkably increasing S/N ratio as the static characteristics, suppressing multipath noises, distorting no sound signal, and being manufactured at low cost.

In order to accomplish above purposes, a first aspect of the present invention provides a noise suppression apparatus comprising: a receiving means for selectively receiving a radio wave signal to be received and transforming it into an electric signal; a field information detecting means for detecting an electric field information of said radio wave signal received by said receiver; a noise suppression control means for suppressing a noise component contained in said electric signal outputted from said receiving means on the basis of said electric field information detected by said field information detecting means; and an output means for outputting a noiseless signal outputted from said noise suppression control means.

Furthermore, a second aspect of the present invention provides a noise suppression apparatus comprising: a receiving means for selectively receiving a radio wave signal to be received and transforming it into an electric signal; a field information detecting means =for detecting electric field information of said radio wave signal received by said receiving means; a noise data generating means for generating a noise pattern on the basis of said electric field information detected by said field information detecting means; a noise cancel means for canceling an noise component of said signal outputted from said receiving means on the basis of said noise pattern generated by said noise data generating means; and an output means for outputting a noiseless signal outputted from said noise cancel means.

Still further, a third aspect of the present invention provides a noise suppression apparatus comprising: an A/D converter for converting an analogue radio wave signal into a digital signal; a signal transformer for transforming said digital signal into an appropriate signal form; a noise data generating means for generating a noise pattern on the basis of an electric field information; a noise cancel means for receiving an output of said signal transformer and an output of said noise data generating means to cancel an noise component of said signal outputted from said signal transformer on the basis of Said noise pattern generated by said noise data generating means; an inverse signal transformer for receiving an output of said noise cancel means and executing an inverse processing of said signal transformer; and a D/A converter for converting an output of said inverse signal transformer into a noiseless analogue signal.

Yet further a fourth aspect of the present invention provides a noise suppression apparatus comprising: a receiving means for selectively receiving a radio wave signal to be received and transforming it into an electric signal; a field information detecting means for detecting electric field information of said radio wave signal received by said receiving means; a noise data generating means for generating a noise pattern on the basis of said electric field information detected by said field information detecting means; a signal judging means for receives said signal from said receiving means and judging a kind of said signal; a noise cancel means for canceling an noise component of said signal outputted from said receiving means on the basis of said noise pattern generated by said noise data generating means and said kind of said signal judged by said signal judging means; and an output means for outputting a noiseless signal outputted from said noise cancel means.

Moreover, a fifth aspect of the present invention provides a noise suppression apparatus comprising: a receiving means for selectively receiving a radio wave signal to be received and transforming it into an electric signal; a field information detecting means for detecting multipath information of said radio Wave signal received by said receiving means; a multipath noise data generating means for generating a multipath noise pattern on the basis of said multipath information detected by said field information detecting means; a noise Cancel means for canceling a multipath noise component of said signal outputted from said receiving means on the basis of said multipath noise pattern generated by said multipath noise data generating means; and an output means for outputting a noiseless signal outputted from said noise cancel means..

The above and other objects, features and advantages of the present invention will become more apparent from the following detailed description which is to be read in conjunction with the accompanying drawings.

BRIEF DESCRIPTION OF THE DRAWINGS.

FIGS. 14(a), 14(b), and 4(c) are graphs; showing examples of multipath signals;

DETAILED DESCRIPTION OF THE PREFERRED EMBODIMENTS

Hereinafter, with reference to accompanying drawings, preferred embodiments of the present invention will be explained in detail.

FIRST EMBODIMENT

Figure 1:
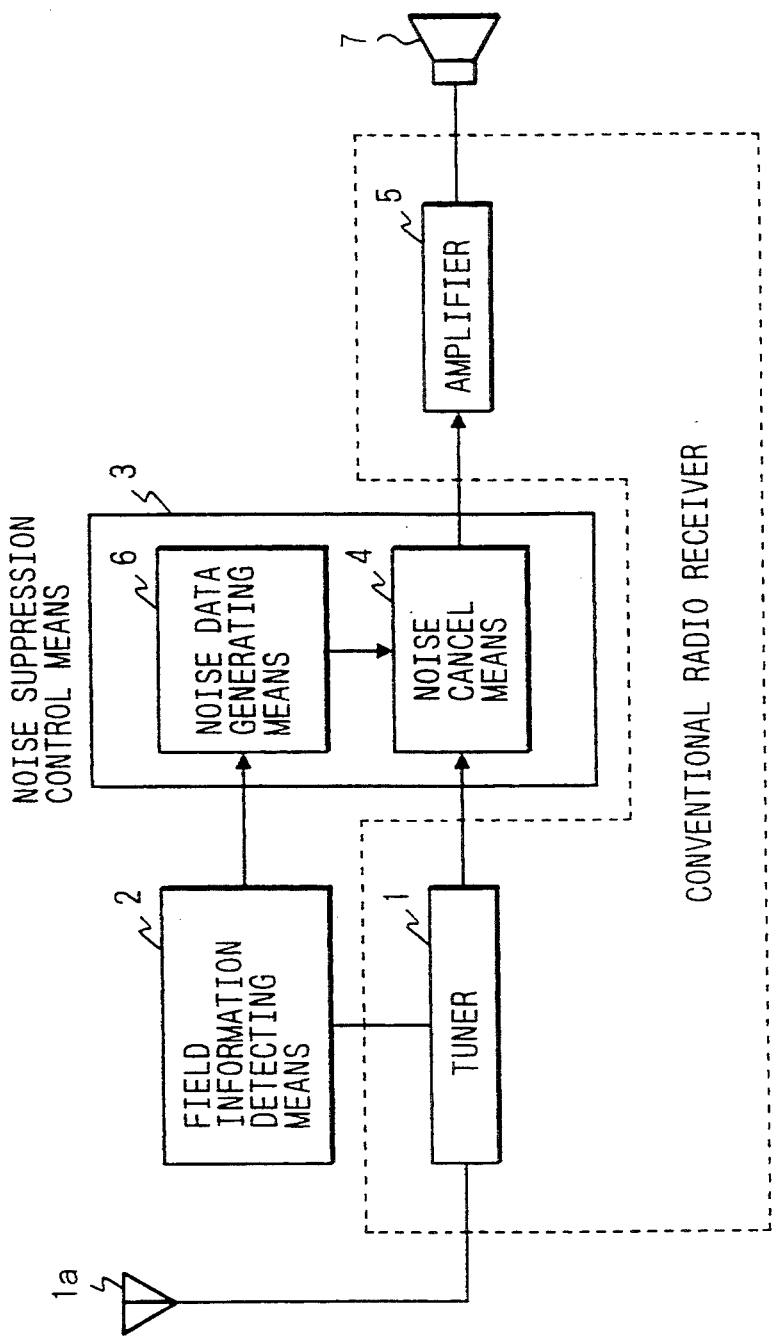
FIG. 1 is a schematic block diagram showing the present invention.

FIG. 1 is a schematic diagram showing the concept of the present invention. In FIG. 1, a reference numeral 1 represents a tuner, which serves as a receiving means in the present invention. This tuner 1 detects a radio wave to be received and transforms it into an electric signal. AM and FM tuners are known as this type of receiver.

The tuner 1 is normally connected with an antenna 1a to improve its sensitivity. A reference numeral 2 represents a field information detecting means, which detects electric field condition at the place where the radio wave is received and at the frequency thereof.

Figure 21:
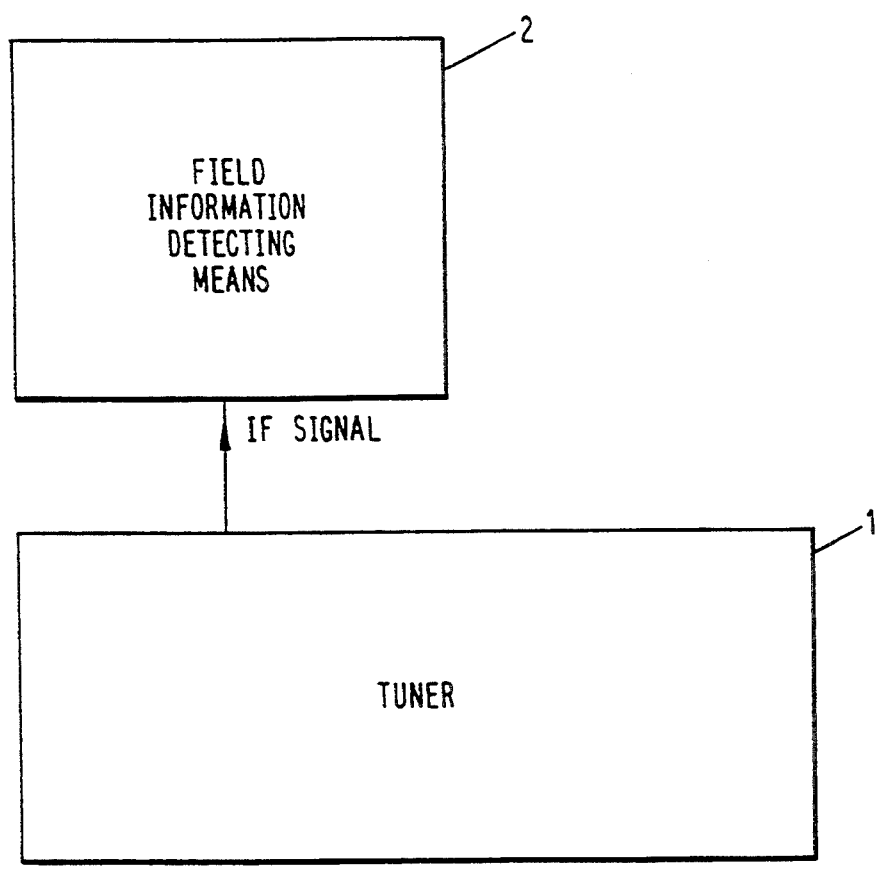
FIG. 21 illustrates a feature of the invention.

This field information detecting means 2 chooses an intermediate-frequency signal (e.g. 10.7 MHz in case of FM broadcasting, and 450 kHz in Case of AM broadcasting) from the tuner 1. By analyzing the components of this intermediate-frequency signal—such as a stereo pilot signal, the field information detecting means 2 detects the strength of the electric field and the influence of the multipath to the received signal. The detecting result of the field information detecting means 2 is transmitted to a noise suppression control means 3. The strength of the electric field can be measured by detecting a direct-current component (signal level) of the intermediate-frequency signal. On the other hand, the influence of the multipath can be measured by detecting an amplitude (AM level) of the intermediate-frequency signal. Thus, as shown in FIG. 21, the field information detecting means 2 operates in response to the IF signal from the tuner 1. The noise suppression control means 3 receives the signal from the tuner 1 and removes the noise component of this input signal. In more detail, the noise suppression control means 3 includes a noise cancel means 4 and a noise data generating means 6. A reference numeral 5 represents an amplifier serving as an output means in the present invention, which feeds the output of the noise suppression control means 3 to a speaker or the like.

Figure 2:
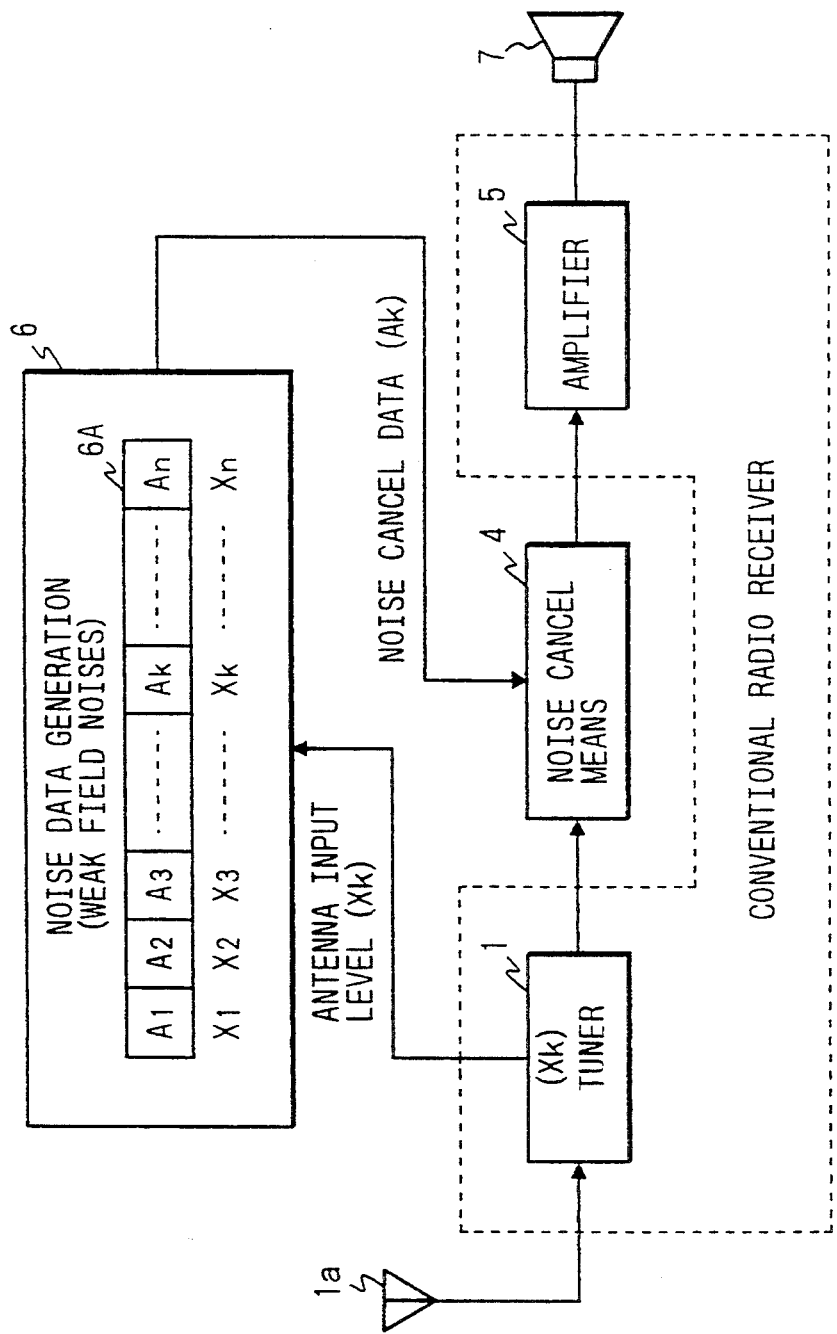
FIG. 2 is a circuit block diagram showing a first embodiment of the present invention.

FIG. 2 is a detailed circuit diagram showing the present embodiment. As shown in FIG. 2, the noise data generating means 6 includes a noise pattern memory 6A. This noise pattern memory 6A memorizes a plurality of noise patterns (e.g. weak electric field noises A1, A2, A3, - - - , Ak, - - - , An) which are determined so as to correspond to various antenna input levels (X1, X2, X3, - - - , Xk, - - - , Xnii), respectively. Here, the noise patterns need not be always memorized in the noise pattern memory 6A.

The noise data generating means 6 can analyze a generating source of noise on the basis of various components of the output from the tuner 1 and produce or synthesize a noise corresponding to, for example, the strength of the electric field.

Though various factors are considered as the source of noise generation, the noise data generating means 6 in this embodiment synthesizes the noise data on the basis of the noise change with respect to the change of the electric field strength. Namely, one of sources of noise generation is the IC used in the receiver 1. Which circuit causes the noise depends on the strength of the electric field in the noise generation by this IC. Therefore, it is possible to make a plurality of noise patterns in accordance with various strengths of the electric field.

In this embodiment, the noise patterns are calculated in advance with respect to various strengths of the electric field. These noise patterns are memorized in the noise pattern memory 6A, and are read out from this noise pattern memory 6A in the noise suppression Operation. By the way, it is possible to produce this noise patterns from the calculation using the parameter of the electric field strength or the multipath. The noise suppression utilizing the multipath will be described later.

As shown in FIG. 2, the antenna input level (Xk) is directly inputted from the tuner 1 to the noise data generating means 6. This antenna input level (Xk) functions as the field information detecting means 2 in the present invention. In other words, no special circuit is required for providing this field information detecting means 2 in the present invention.

The noise data generating means 6 selects an optimum noise pattern Ak in accordance with the antenna input level Xk, and outputs thus selected noise pattern Ak as a noise cancel data (Ak) to the noise cancel means 4.

Figure 3:
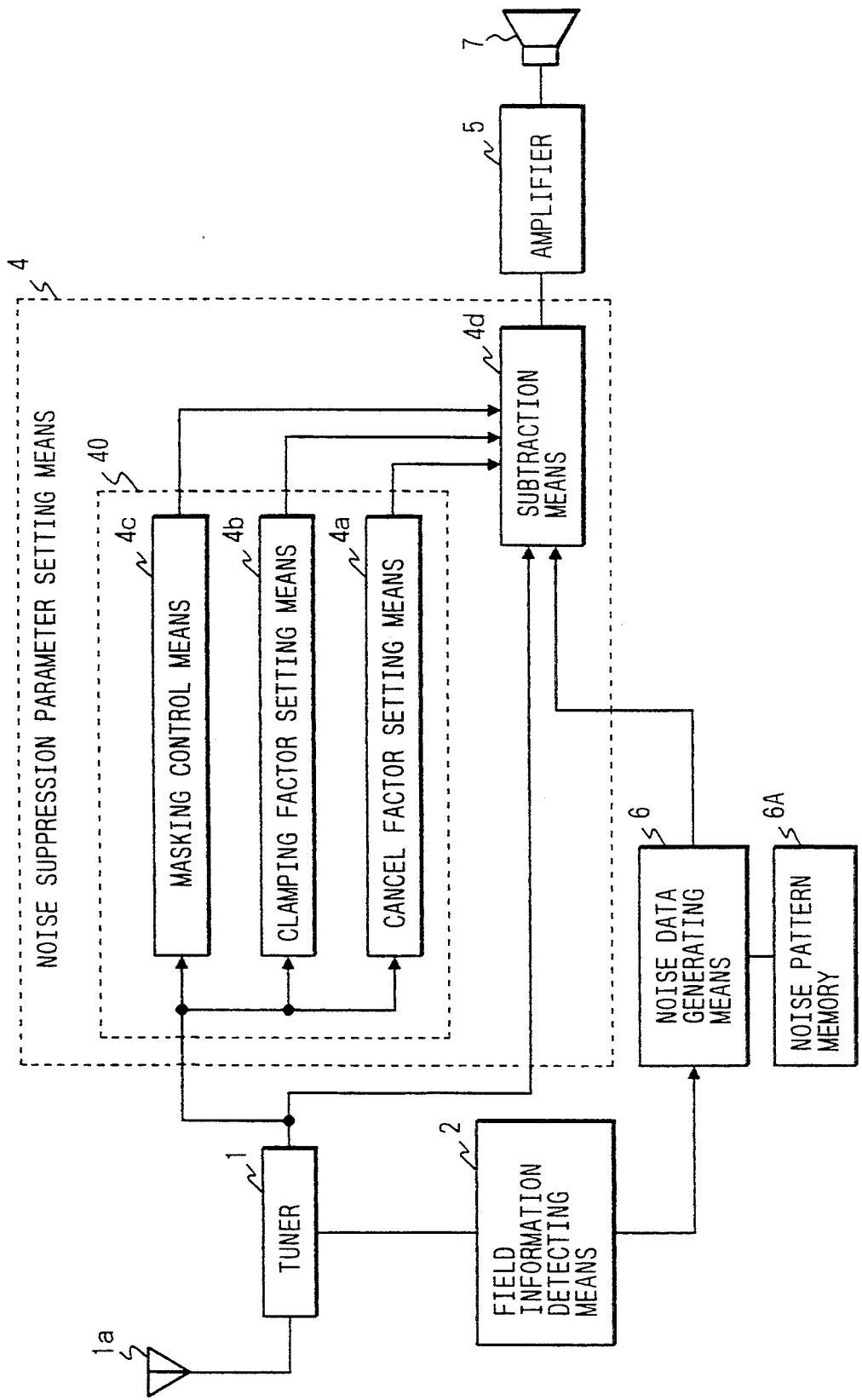
FIG. 3 is a detailed circuit diagram showing the first embodiment of the present invention.

Next, with reference to FIG. 3, the noise cancel means 4 used in this embodiment is explained in detail. As shown in FIG. 3, the noise cancel means 4 includes a cancel factor setting means 4a, a clamping factor setting means 4b, a masking control means 4c, and a subtraction means 4d. The cancel factor setting means 4a sets a cancel factor to each frequency band of the input signal. The clamping factor setting means 4b generates a clamping factor, which is used to control the cancel factor in,the canceling operation of noise so as to suppress adverse affection of the noise removal. The masking control means 4c functions to judge whether or not the clamping factor should be set by the clamping factor setting means 4b. In the subtraction operation of the noise, the masking control means 4c detects noise levels of upper and lower frequencies adjacent to the frequency of the noise to be subtracted. If the noise component of the adjacent frequency is extraordinarily large (larger than a predetermined large value), the masking control means 4c prevents the clamping factor from being set.

The cancel factor setting means 4a, the clamping factor setting means 4b, and the masking control means 4c constitute a noise suppression parameter setting means 40. The subtraction means 4d receives signals from the noise suppression parameter setting means 40 and subtracts the noise component from the input signal fed from the tuner 1.

Figure 4:
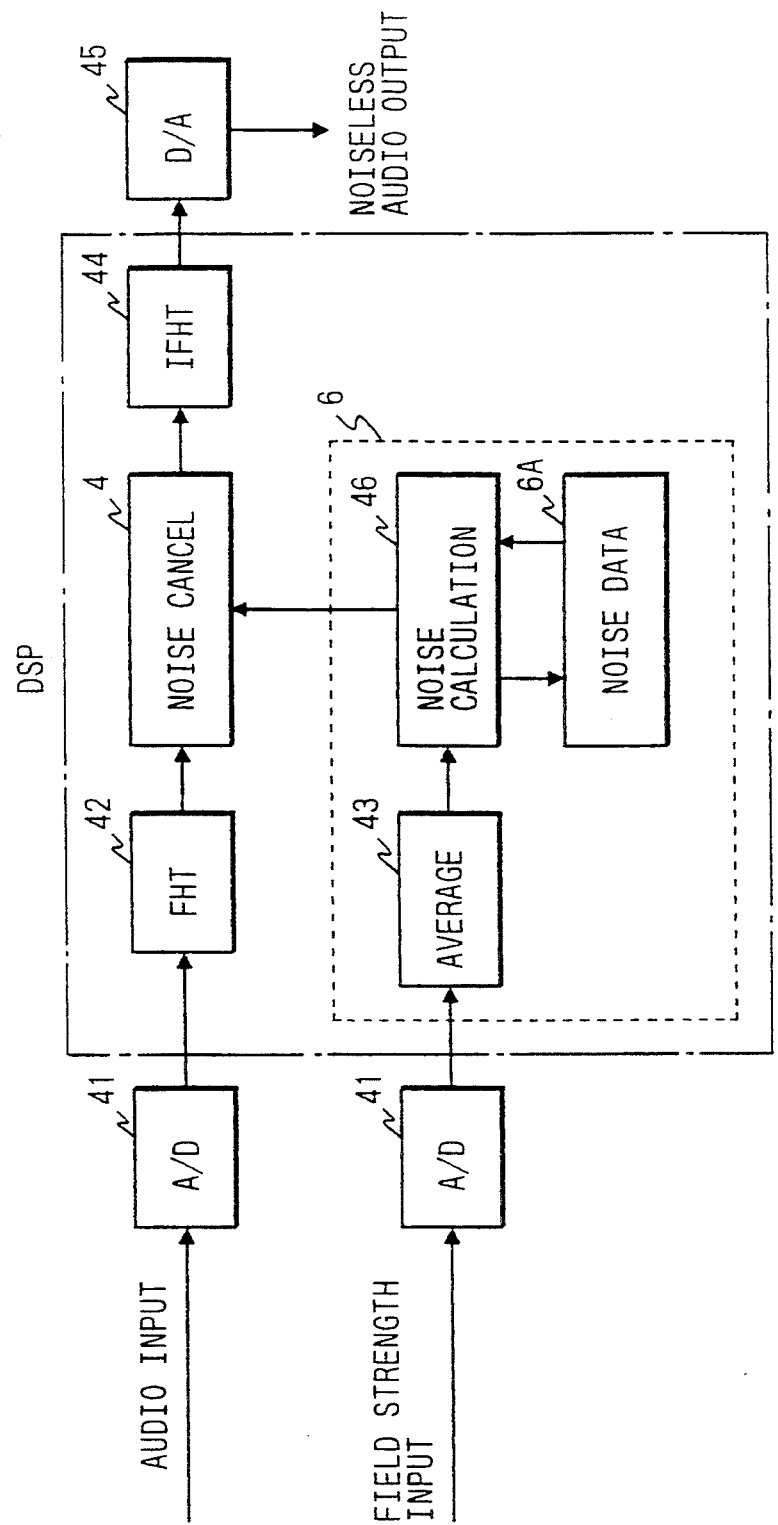
FIG. 4 is a circuit diagram for a digital signal processing in the first embodiment of the present invention.

FIG. 4 is a circuit diagram used for a digital signal processing (abbreviated by DSP) in the first embodiment of the present invention. In FIG. 4, a reference numeral 41 represents an A/D converter, which transforms an analogue signal into a digital signal. A reference numeral 42 represents a fast hartley transformer (abbreviated by FHT), which transforms the digital signal (e.g. audio signal) inputted through one A/D 41 into an appropriate signal whose noise pattern is easy to process. An output of the fast hartley transformer 42 is calculated by the following equation (1).

$$H(k) = \sum_{n=0}^{N-1} X(n) \cdot \text{cas}(2\pi k/N) \quad (1)$$

$$(k = 0, 1, \ldots, N-1)$$

-continued
$$\text{cas}(\theta) = \cos(\theta) + \sin(\theta)$$

A reference numeral 44 represents an inverse fast hartley transformer (abbreviated by IFHT), which carries out an inverse processing of the fast hartley transformer 42. A reference numeral 45 represents a D/A converter, which performs the opposite function of the A/D converter 41

A reference numeral 43 represents an average circuit, which obtains an average of signals representing electric field strengths inputted through the other A/D 41. A noise calculation circuit 46 receives the averaged electric field signal from the average circuit 43 and synthesizes a noise signal on the basis of thus obtained average electric field signal and the noise data memorized in the noise pattern memory 6A. The synthesized noise is fed into the noise cancel means 4, in which the output of the fast hartley transformer 42 is processed by use of this synthesized noise so as to remove the noise components thereof. Then, the (audio) signal is fed to the IFHT 44 and the D/A 45 and outputted as a noiseless audio signal.

That is, the digital signal processing (DSP) section is constituted by the FHT 42, the noise cancel means 4, the IFHT 44, the average circuit 43, the noise calculation circuit 46, and the noise pattern memory 6A.

Next, an operation of the first embodiment described in the foregoing description will be discussed below.

First of all, the tunnel receives a radio wave signal to be received and transforms it into an electric signal. Subsequently, the field information detecting means 2 detects an electric field strength of the signal to be received on the basis of an intermediate-frequency component of the signal received by the tuner 1. Furthermore, the field information detecting means 2 detects the multipath condition at the frequency of the signal to hie received. Next, these signals are transmitted to the noise suppression control means 3, in which the noise suppression operation is carried out in the following manner.

Figure 5A:
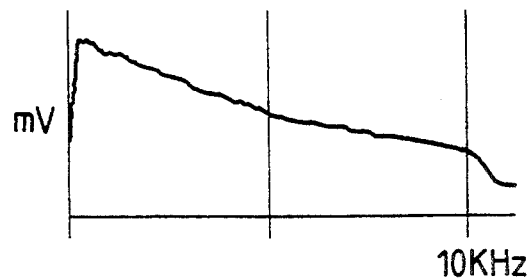
FIGS. 5(a) to 5(c) are graphs showing noise patterns used in the first embodiment of the present invention.
Figure 5B:
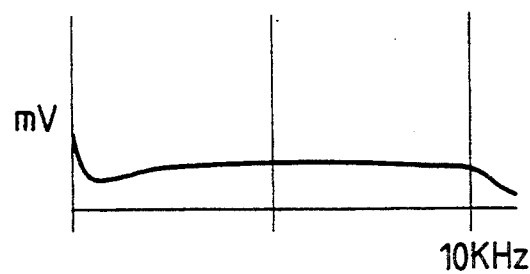

The noise pattern is produced on the basis of the information supplied from the field information detecting means 2. In this first embodiment, several noise patterns, some of which are shown in FIG. 5, are calculated in advance and memorized in the noise pattern memory 6A. In the production of noise patterns, some of these pre-memorized noise patterns are read out from the noise pattern memory 6A. FIG. 5(a) shows a noise pattern in the case where the input level of the radio wave signal is 10 dB, and FIG. 5(b) shows a noise pattern in the case where the input level of the radio wave signal is 20 dB. Furthermore, FIG. 5(c) shows a noise pattern in the case where the input level of the radio wave signal is 60 dB.

Figure 5C:
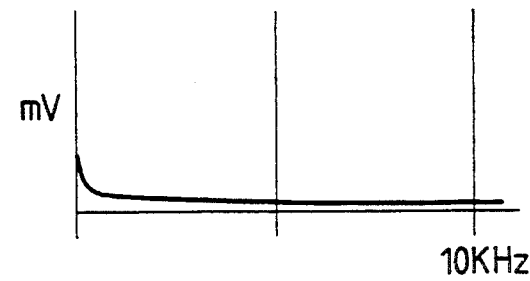

The following explanation supposes to use only three noise patterns shown in FIGS. 5(a) to 5(c). How this embodiment synthesizes the noise patterns corresponding to each of electric field strengths by using only three noise patterns will be explained below, with reference to FIG. 6.

Figure 6:
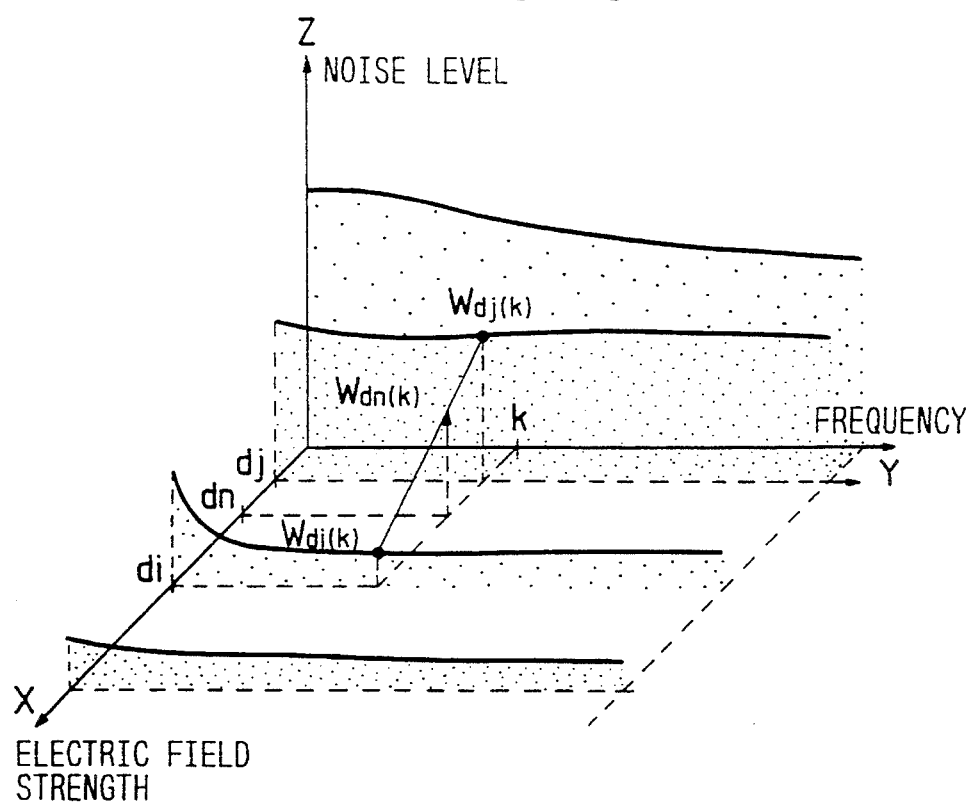
FIG. 6 is a view showing how a noise pattern is obtained in the first embodiment of the present invention.
Figure 7:
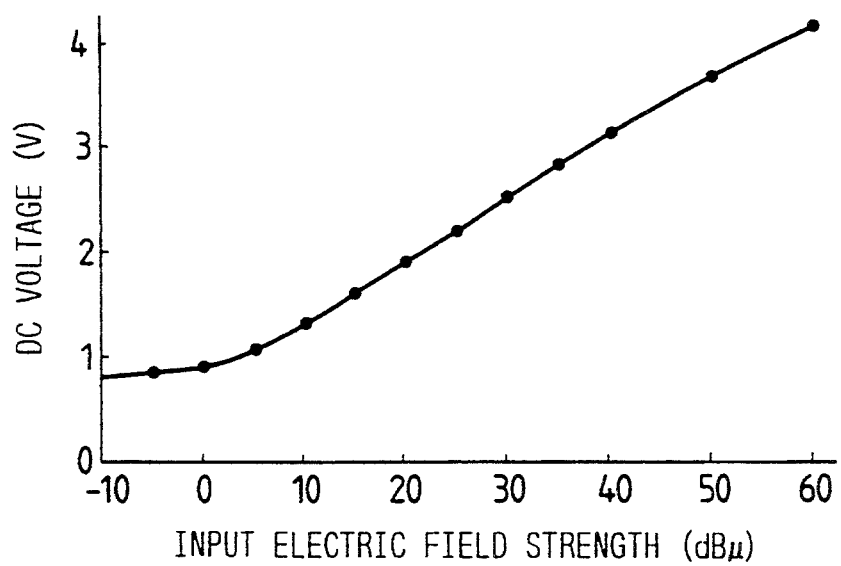
FIG. 7 is a graph showing a relationship between the input electric field strength and the output voltage of the tuner in accordance with the first embodiment of the present invention.

In FIG. 6, X-axis, Y-axis, and Z-axis represent an electric field strength, a frequency, and a noise level, respectively. The noise level $W_{dn}$ decreases as the electric field strength dn increases. Here, let the electric field strengths di and dj have noise patterns $W_{di(k)}$ and $W_{j(k)}$, which are functions of frequency k as shown in FIG. 6. Now, if the electric field strength dn has a value between di and dj, its noise pattern $W_{dn(k)}$ is obtained by linearly obtaining approximation on the basis of two noise patterns $W_{di(k)}$ and $W_{dj(k)}$. As the input electric field strength has a good linear relationship with the signal; level inputted from the tuner 1, this linear approximation can be easily realized. FIG. 7 is a graph showing a relationship between the input electric field strength and the output voltage of the tuner 1.

Therefore, the noise pattern memory 6A memorizes predetermined number of noise patterns (A1, A2, A3, - - -, Ak, - - -, An) corresponding to several electric field strengths, so as to obtain a good approximation with these pre-memorized noise patterns (A1, A2, $A^3$, - - -, Ak, - - -, An). It is possible to make additional noise patterns defined by the parameter of multipath signal. Such a modification will be described in detail in the third embodiment.

Next, the noise pattern (i.e. the noise cancel data) produced in the noise pattern generating means 6 is supplied to the noise cancel means 4 so as to subtract the noise component from the output of the tuner 1. However, it should be noted that there is a particular noise sound remaining in the case where the noise pattern is directly subtracted from the output of the tuner 1. In order to prevent this kind of particular noise from generating, the clamping factor setting means 4b sets an upper limit to the subtraction of noise in the case where the original signal is not so large even if the noise pattern is fairly large. (Namely, a value of $\alpha$ is controlled in the equation 4).

The subtraction of noise pattern is carried out in each frequency band of a plurality of predetermined frequency bands in this embodiment. Here the inventors of the present invention found the remarkable fact. Under the condition that a signal having a certain frequency component is fairly large while signals having upper and lower frequency components adjacent to this certain frequency are fairly small, these small signals can be completely removed as noises without giving any adverse affection to the tone quality of the music.

Accordingly, the masking control means 4c of this embodiment controls the cancel factor used in the subtraction operation of the noise pattern, on the basis of the comparison with noise levels of upper and lower frequencies adjacent to the frequency of the noise to be subtracted. Finally, the signal, whose noise is subtracted in this manner, is outputted from the amplifier 5.

Figure 8:
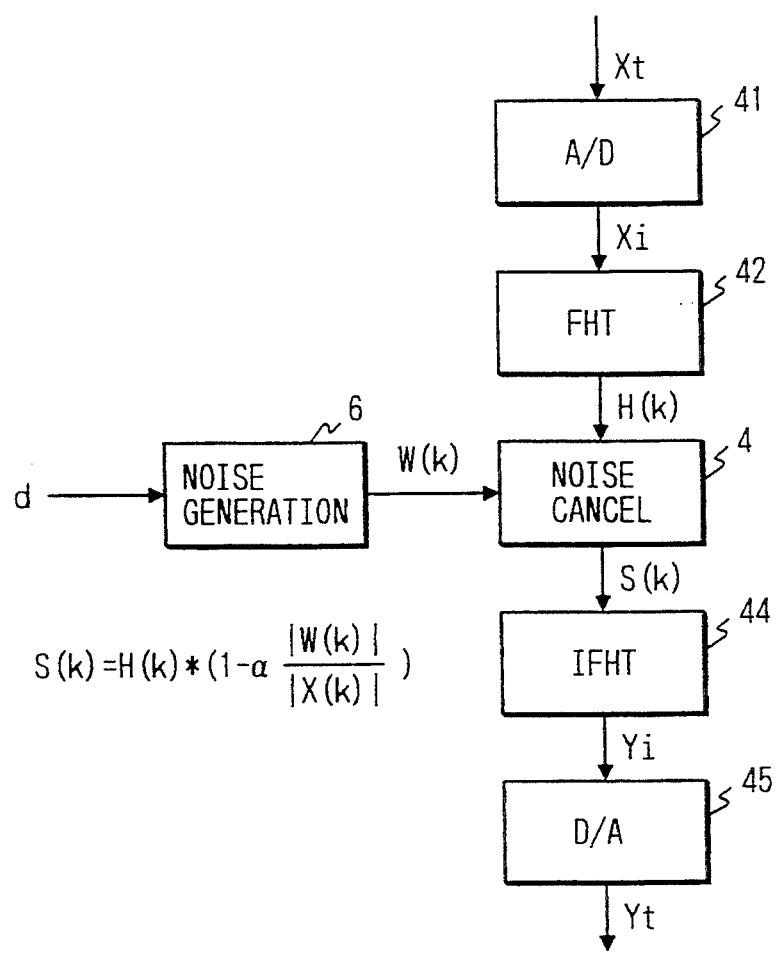
FIG. 8 is a signal flowchart showing an operation of the first embodiment of the present invention.

An operation of this embodiment is expressed, in the signal flowchart of FIG. 8. An analogue input signal Xt is transformed into a digital signal Xi through the A/D converter 41. The FHT 42 transform is this digital signal Xi into a signal H(k) through the fast; hartley transformation. On the other hand, the noise generating means 6 generates a noise pattern W(k) in accordance with an electric field d. The noise cancel means 4 receives these signals H(k) and W(k) and generates a noiseless signal S(k). This signal S(k) is inversely transformed into a digital signal Yi in the IFHT 44 and, then, is transformed into an perceivable analogue signal Yt through the D/A converter 45.

Figure 9:
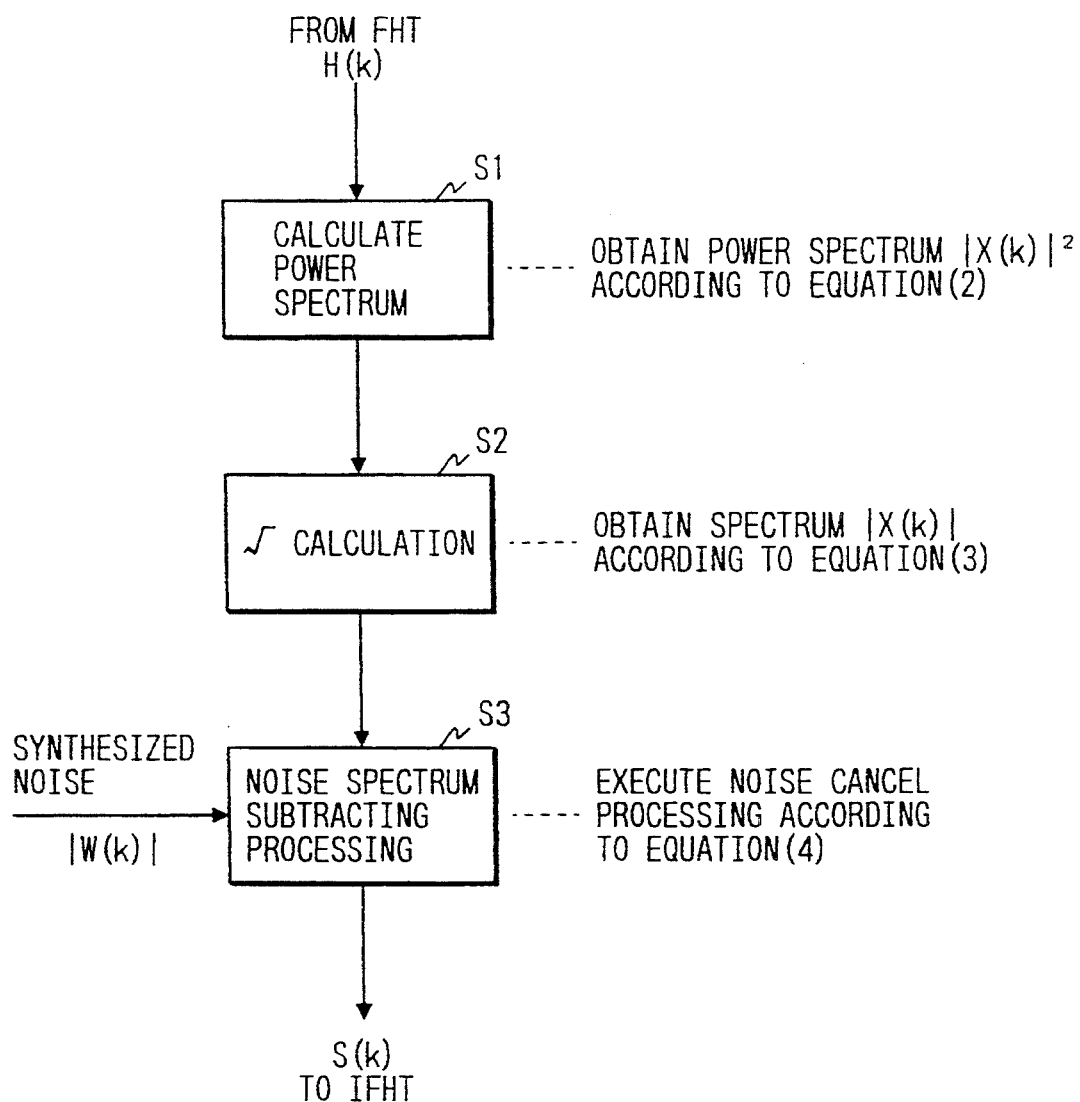
FIG. 9 is a flowchart showing an operation of the first embodiment of the present invention.

The noise cancel processing in the noise cancel means 4 is explained in more detail with reference to the flowchart of FIG. 9. First of all, in a step S1, the noise cancel means 4 obtains a power spectrum $|X(k)|^2$ on the basis of the output signal H(k) of the FHT 42. In this embodiment, the calculation of the power spectrum $|X(k)|^2$ is carried out in accordance with the following equation (2).

$$|X(k)|^2 \frac{1}{2} \cdot \{H^2(k) + H^2(N-k)\} \quad (2)$$

Secondly, in a step S2, a square root of thus obtained power spectrum $|X(k)|^2$ is obtained in accordance with the following equation (3).

$$\sqrt{x} = -0.1985987 \cdot x^2 + 0.8803385 \cdot x + 0.3175231 \quad (3)$$

Thirdly, the noise cancel processing is executed in a step S3. The calculation of the noise cancel processing is carried out in accordance with the following equation (4).

$$S(k) = H(k) * (1 - \alpha |W(k)| / |X(k)|) \quad (4)$$

$$S(N-k) = H(N-k) * (1 - \alpha |W(k)| / |X(k)|)$$

Wherein, $(1 - \alpha |W(k)| / |X(k)|) \geq \beta$
$\alpha$: 0.5 (in case of an extremely weak electric field) 0.9 (in case of a strong electric field)
$\beta$: 0.5~0.6

With these equations, the speedy processing can be realized so as to be practically used.

Figure 10:
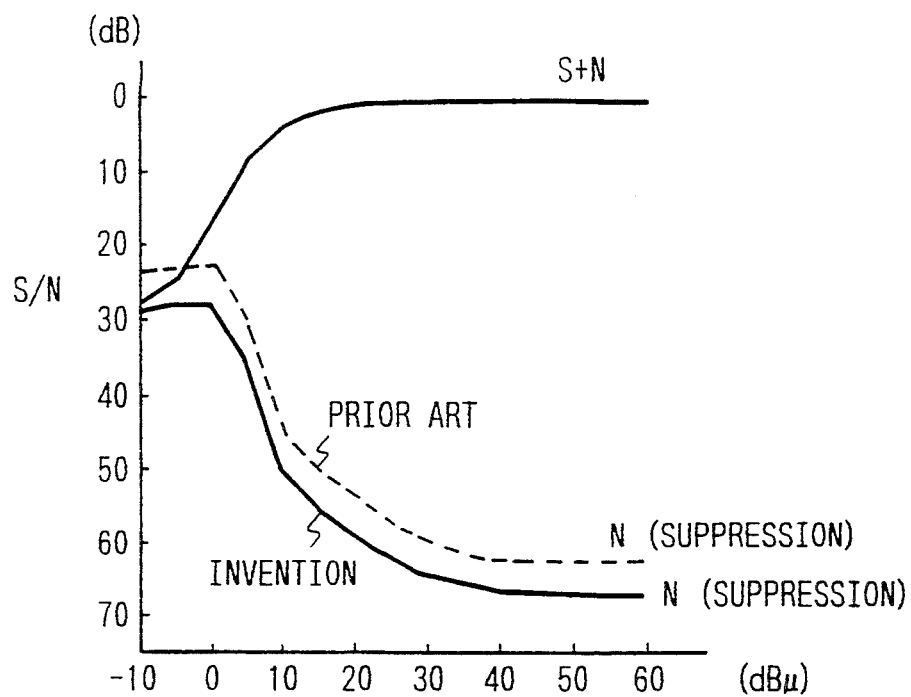
FIG. 10 is a graph showing an improvement of S/N ratio in accordance with the present invention.

FIG. 10 shows the result of the noise suppression. FIG. 10 shows the improvement of S/N ratio with respect to the input electric field level A dotted line represents the result of the conventional noise suppression apparatus, while a solid line represents the result of the present invention. As apparent from FIG. 10, the noise suppression apparatus in accordance with the present invention can bring 5~6 dB improvement of the S/N ratio in the whole range of the electric field.

SECOND EMBODIMENT

Figure 11:
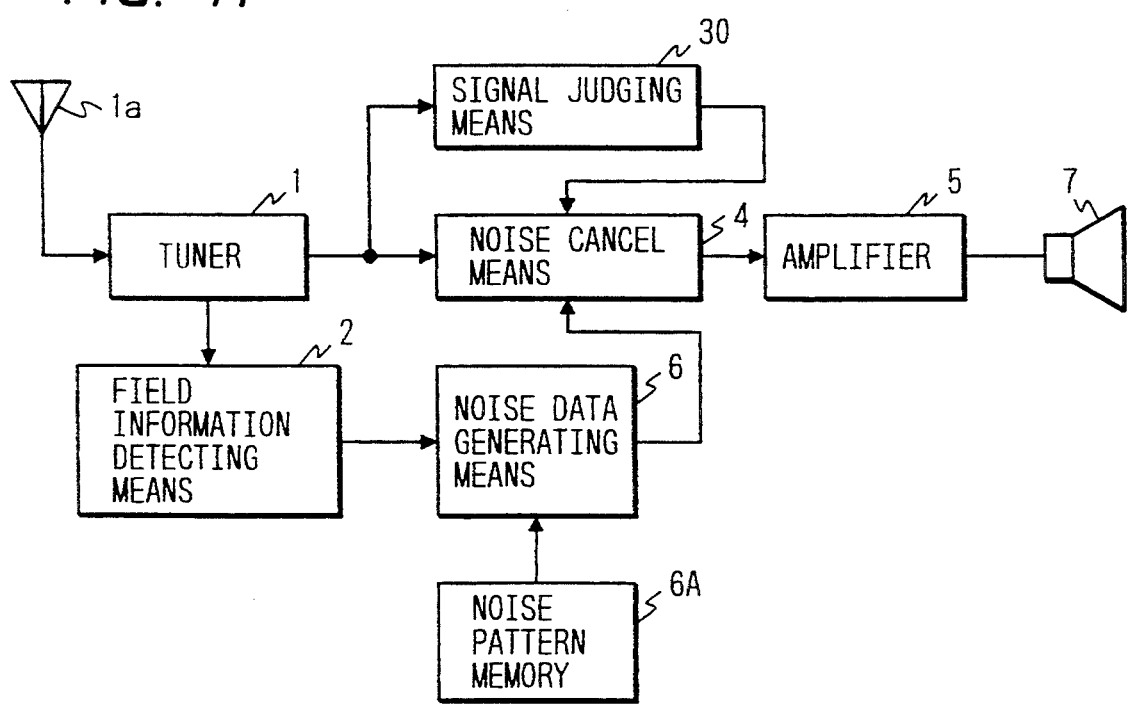
FIG. 11 is a circuit diagram showing a second embodiment of the present invention.

A second embodiment oil the present invention will be explained below. In this second embodiment, a signal judging means 30 is provided in addition to the components of the first embodiment, as shown in FIG. 11. The same components as the first embodiment are suffixed by the same reference numerals.

In FIG. 11, the signal judging means 30 receives an output signal from the tuner 1 and judges a kind of signal to be received on the basis of this output signal from the tuner 1. For example, it is possible to classify the sound signal into categories of a human speech sound, a piano sound, and a drum sound by analyzing the spectrum of the signal and the like. I this embodiment, the signal judging means 30 judges whether the received signal is a human speech sound (i.e. a conversation mode) or a music sound (i.e. a music mode).

If the signal judging means 30 judges the received signal is the music mode, the subtraction means; 4d of the noise cancel means 4 is commanded not to subtract more than 60% of the signal component. That is, the clamping factor setting means 4b uniformly generates a clamping factor of 60% to every frequency component. However, it is needless to say that the value of this clamping factor can be differentiated finely in accordance with the frequency component.

In case of the conversation mode, the clamping factor setting means 4d generates no clamping factor.

In accordance with this embodiment, the signal judging means 30 judges whether the content of the broadcasting is news or music. Accordingly, the clamping factor can be accurately set to cancel noises on the basis of the kind of the received signal. Thus, the noise suppression can be performed without deteriorating tone quality.

THIRD EMBODIMENT

Figure 12:
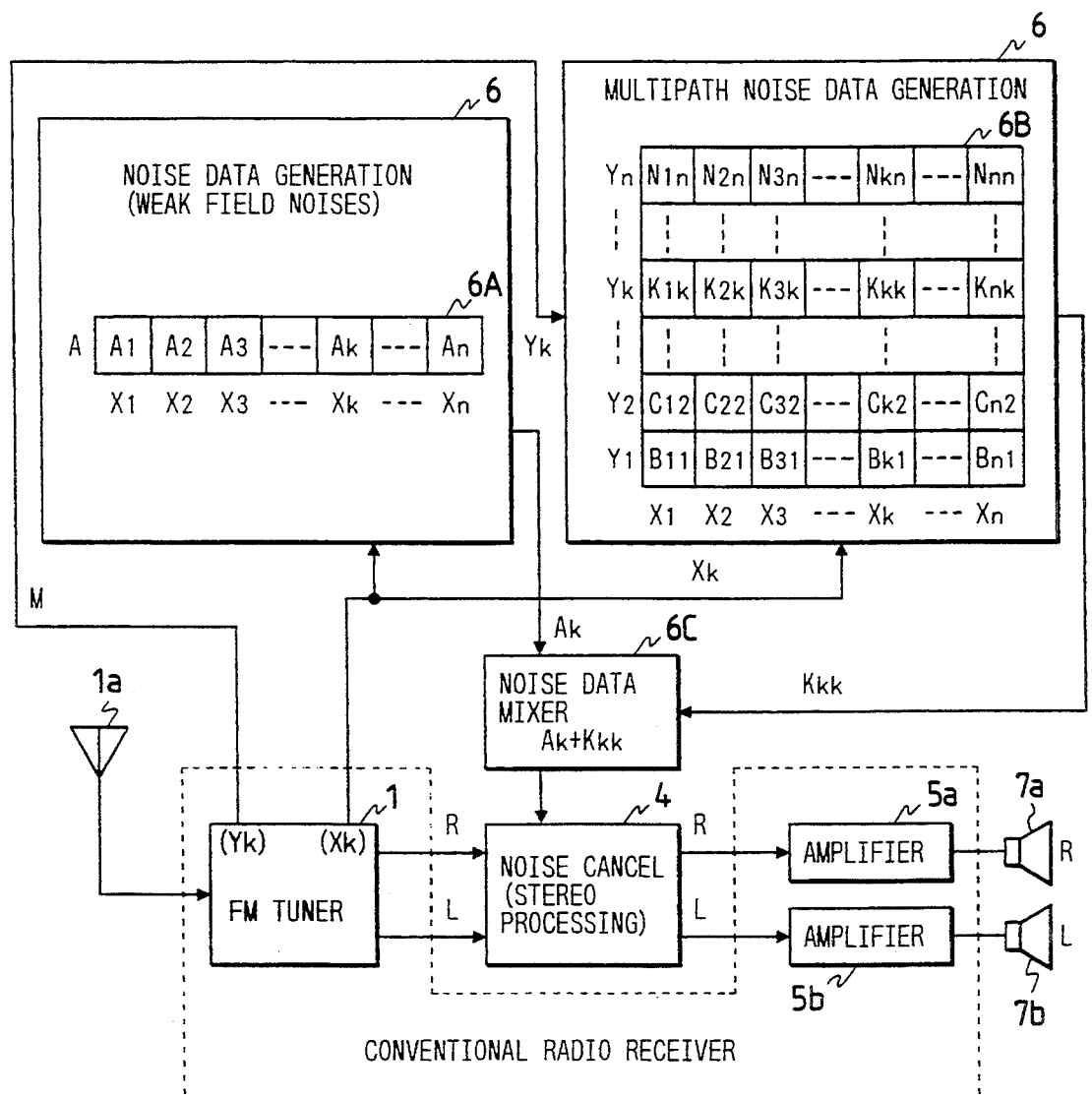
FIG. 12 is a circuit diagram showing a third embodiment of the present invention.

Next, a third embodiment of the present invention will be explained with reference to the drawings. FIG. 12 shows a circuit block diagram of the third embodiment. The same components as those of the previous embodiments are suffixed by the same reference numerals. This embodiment has a purpose to realize the removal of the multipath noise, which was conventionally impossible, by using the DSP technology. The basic constitution of this third embodiment is similar to that of the first embodiment.

As shown in FIG. 12, the noise data generating means 6 include a multipath noise generating means 6B. This multipath noise generating means 6B basically receives a multipath signal M of the field information detecting means 2 (i.e. an output Yk from the FM tuner 1) and generates a multipath noise data $K_{kk}$ so as to cancel the multipath noise in the noise cancel means 4.

How the field information detecting means 2 detects the presence of the multipath noise will be explained next. Compared with AM signals, the characteristic feature of FM signals is that the frequency of the FM signal varies in response to the sound signal while its amplitude is maintained at a constant value.

Figure 13A:
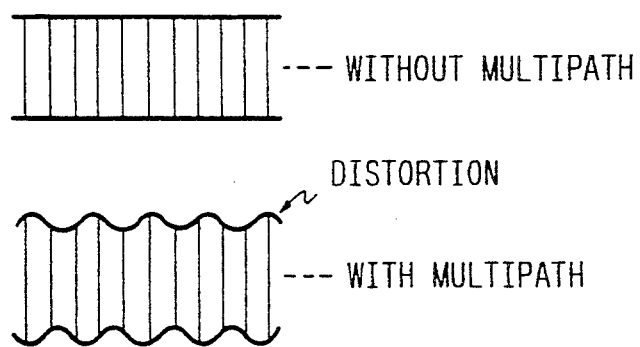
FIGS. 13(a) and 13(b) are views showing multipath signals.

After the radio wave signal is received and tuned, an FM signal is outputted from the intermediate-frequency amplifier. The amplitude of this FM signal does not vary under the condition of no presence of multipath, even in the range where the limiter of the intermediate-frequency amplifier does not work yet. However, if the multipath occurs, a distortion of the modulated sound signals is added to the amplitude of this FM signal. Therefore, the amplitude of the FM signal outputted from the intermediate-frequency amplifier varies under the presence of multipath. (Refer to FIG. 13(a)).

Accordingly, the multipath signal M can be obtained by detecting and amplifying the distortion amount caused by the multipath.

Figure 13B:
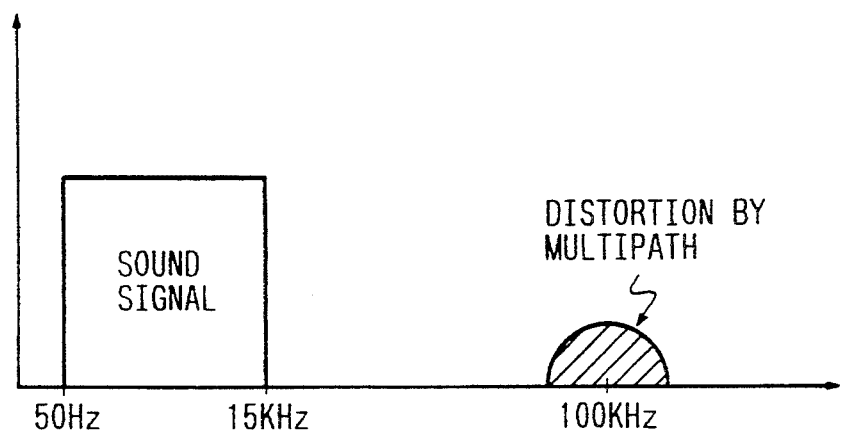

Furthermore, in addition to the amplitude change, the multipath distortion is found in the frequency component when the multipath is generated. That is, the frequency component is also influenced by the multipath component. (Refer to FIG. 13 (b)).

Therefore, this multipath component can be also used as the multipath signal M.

In this embodiment, the field information detecting means 2 supplies this multipath signal M (i.e. the output signal Yk of the FM tuner 1) to the multipath noise data generating means 6B. The multipath noise data generating means 6B constitutes the matrix of the multipath signal (Y1, Y2, ---, Yk, --- Yn) and the antenna input signal (X1, X2, X3, ---, Xk, ---, Xn). That is, the multipath noise pattern $K_{kk}$ is selected from this matrix on the basis of the multipath signal M (i.e. the output signal Yk of the FM tuner 1) and the antenna input signal Xk. It is needless to say that the multipath noise data generating means 6B can be constituted by using only the multipath signal (Y1, Y2, ---, Yk, ---, Yn).

Figure 14A:
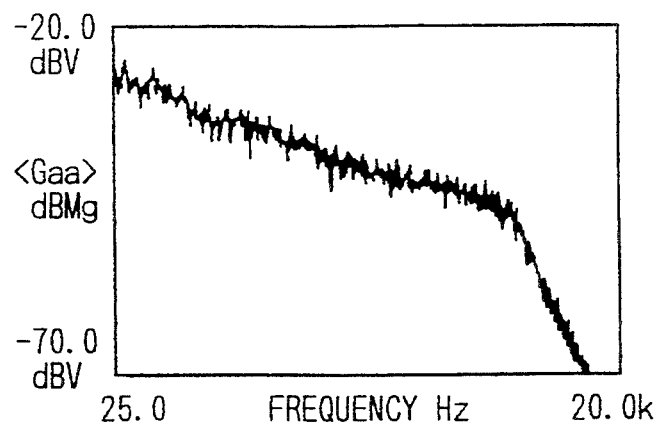
Figure 14B:
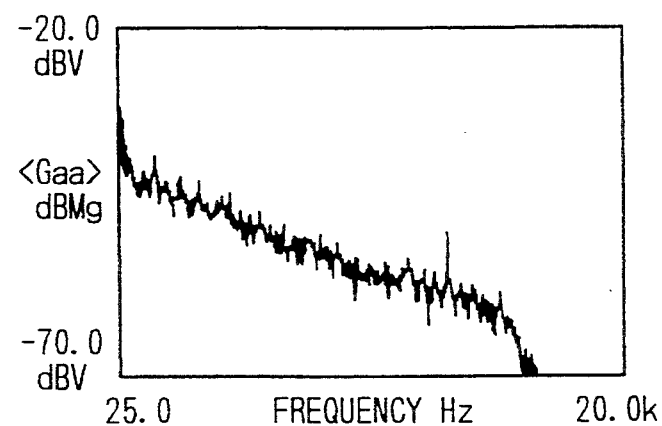
Figure 14C:
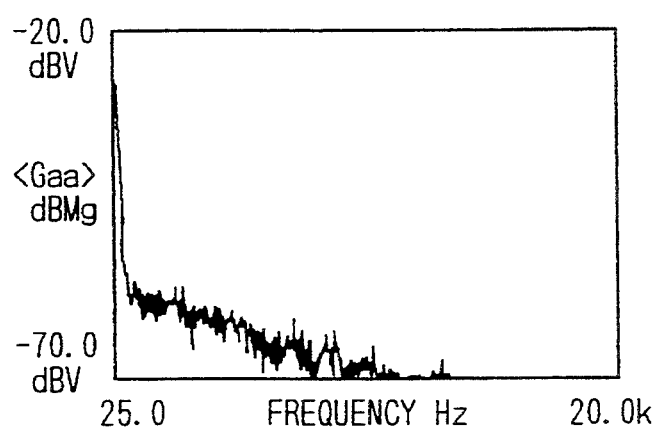

FIG. 14(a) to 14(c) Show several noise patterns of the multipath noise. FIG. 14(a) shows a large multipath noise signal, and FIG. 14(b) shows an intermediate multipath noise signal. And, FIG. 14(c) shows a small multipath noise signal.

The multipath noise pattern $K_{kk}$ is fed from the multipath noise data generating means 6B to a noise data mixer 6C, in which the multipath noise pattern $K_{kk}$ is added with the noise pattern $A_k$. Thus added noise pattern (i.e. noise cancel data) $A_k+K_{kk}$ is supplied to the noise cancel means 4, in which this noise pattern $A_k+K_{kk}$ is subtracted from the output signal of the FM tuner 1. In this embodiment, the stereo processing is carried out for canceling right and left noises.

In accordance with this third embodiment, the field information detecting means 2 outputs the multipath signal and the noise data generating means 6 includes the multipath noise data generating means 6B. With these means, an adequate noise suppression can be performed against the multipath noise without deteriorating the tone quality.

Though the field information detecting means 2 detects only the electric field strength and the multipath condition, it is also possible to detect a signal level of a signal adjacent to the signal to be received, influence by other channels or peripheral devices. By transmitting these signals to the noise data generating means, the noise pattern can be controlled.

Figures 15A, 15B:
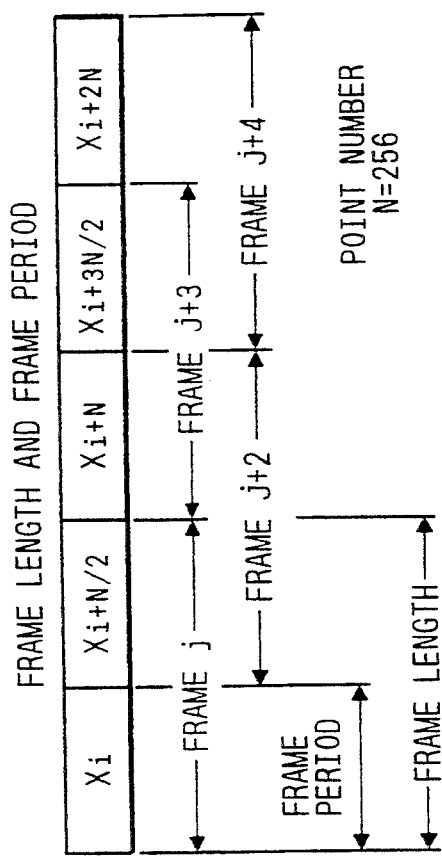
FIGS. 15(a) and 15(b) show a system specification of the embodiment of the present invention.
Figure 16:
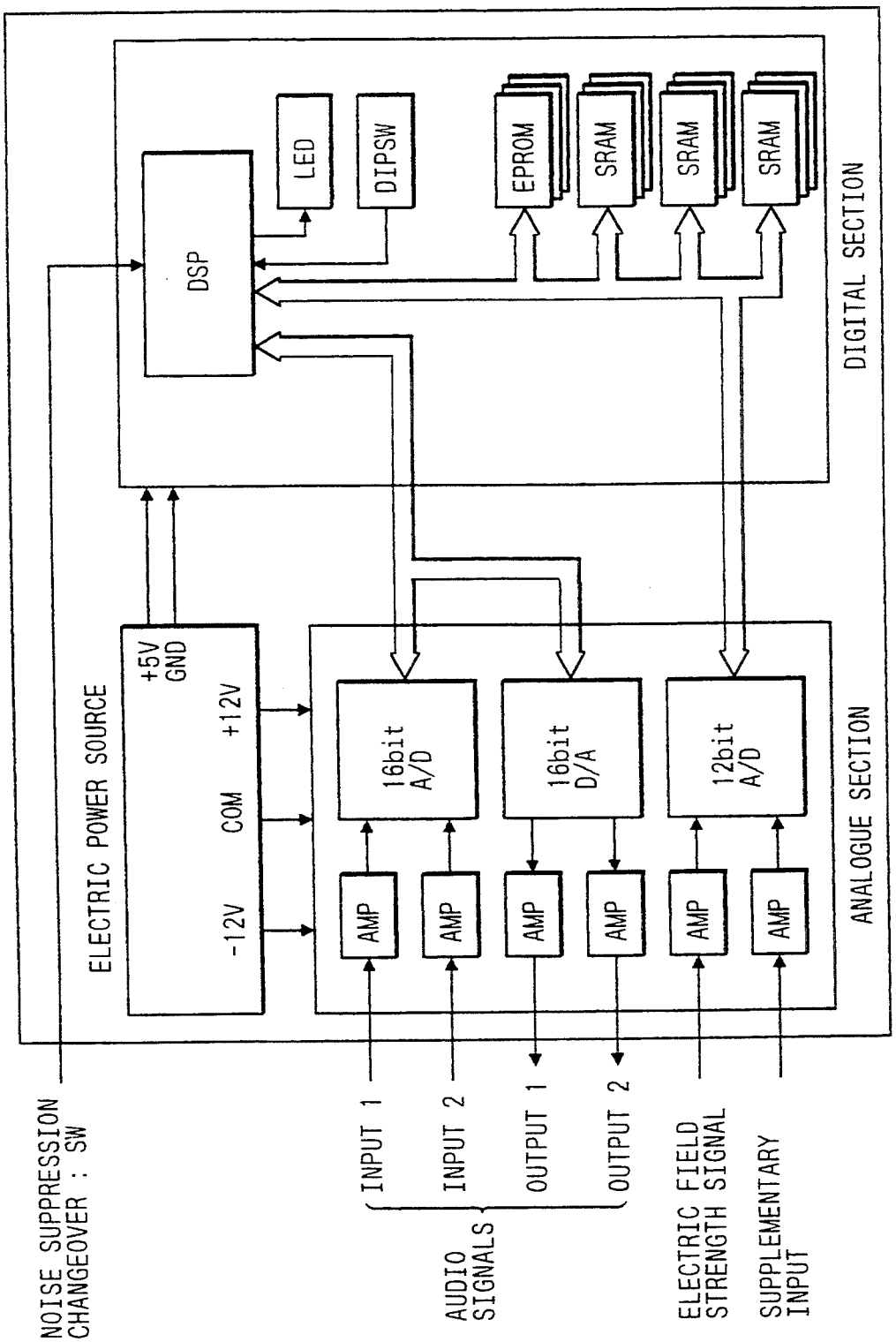
FIG. 16 is a circuit block diagram showing a hardware of the embodiment of the present invention.
Figure 17:
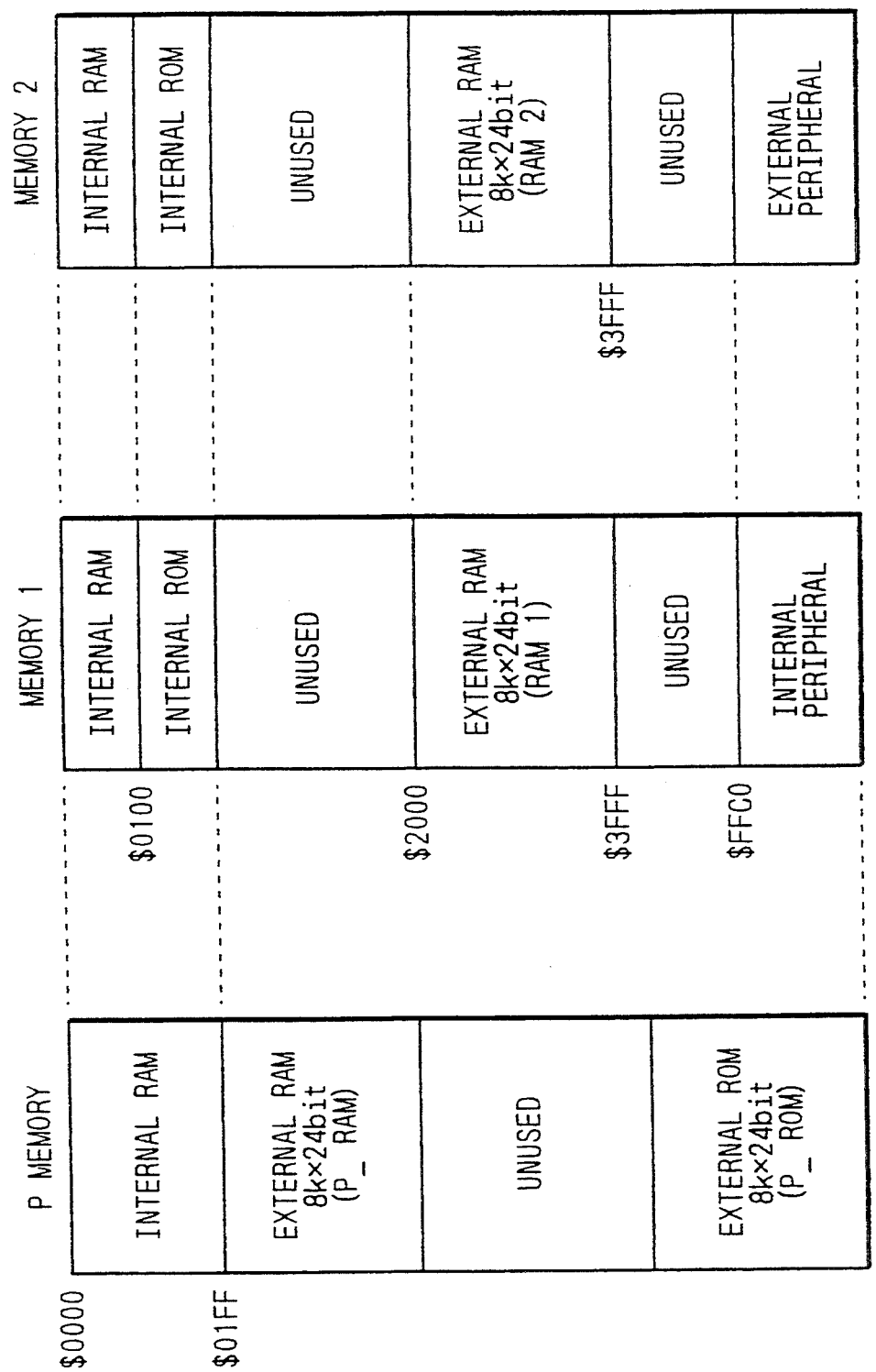
FIG. 17 is a memory layout of the embodiment of the present invention.
Figure 18:
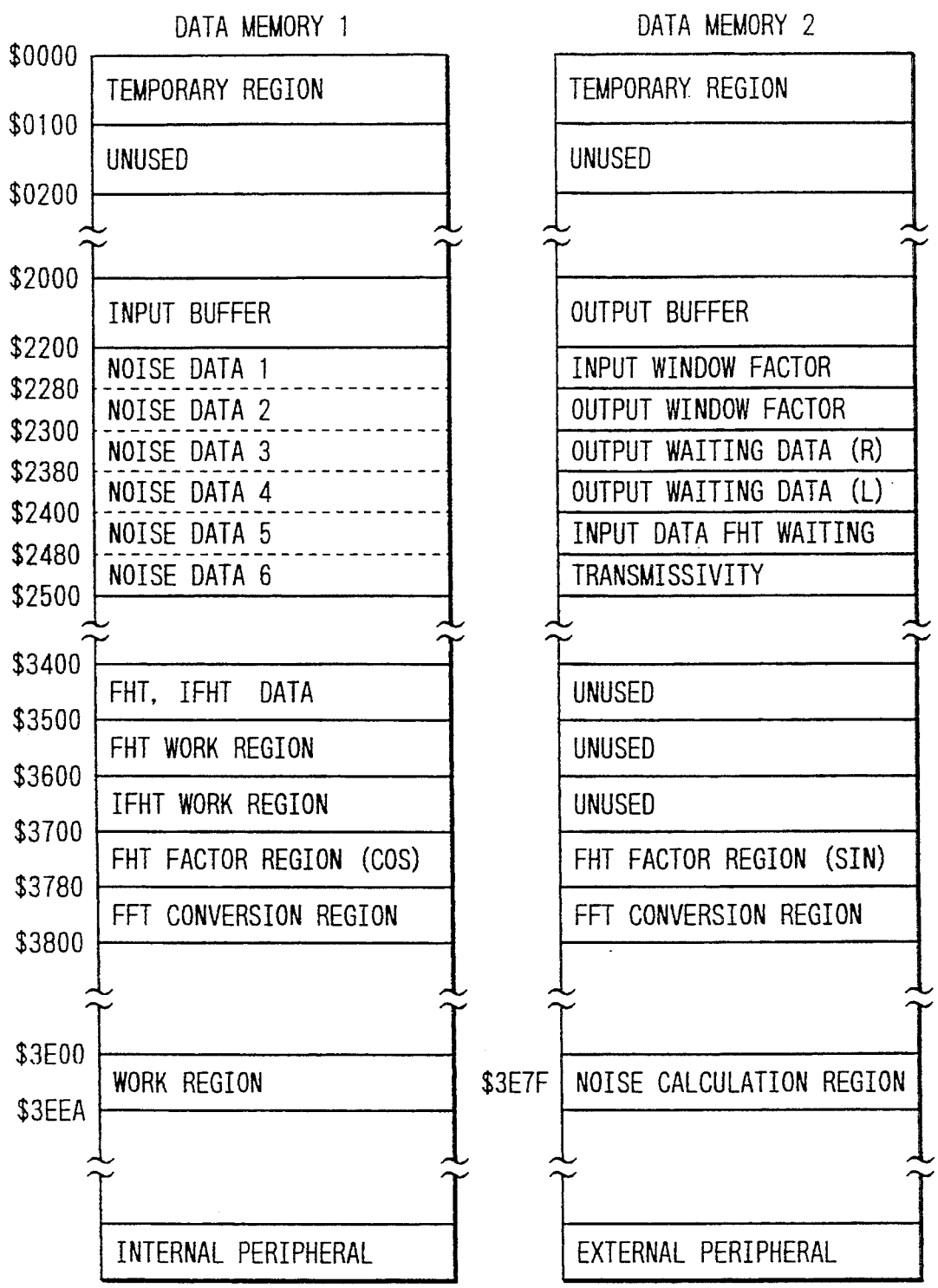
FIG. 18 is a data memory map of the present invention.
Figure 19:
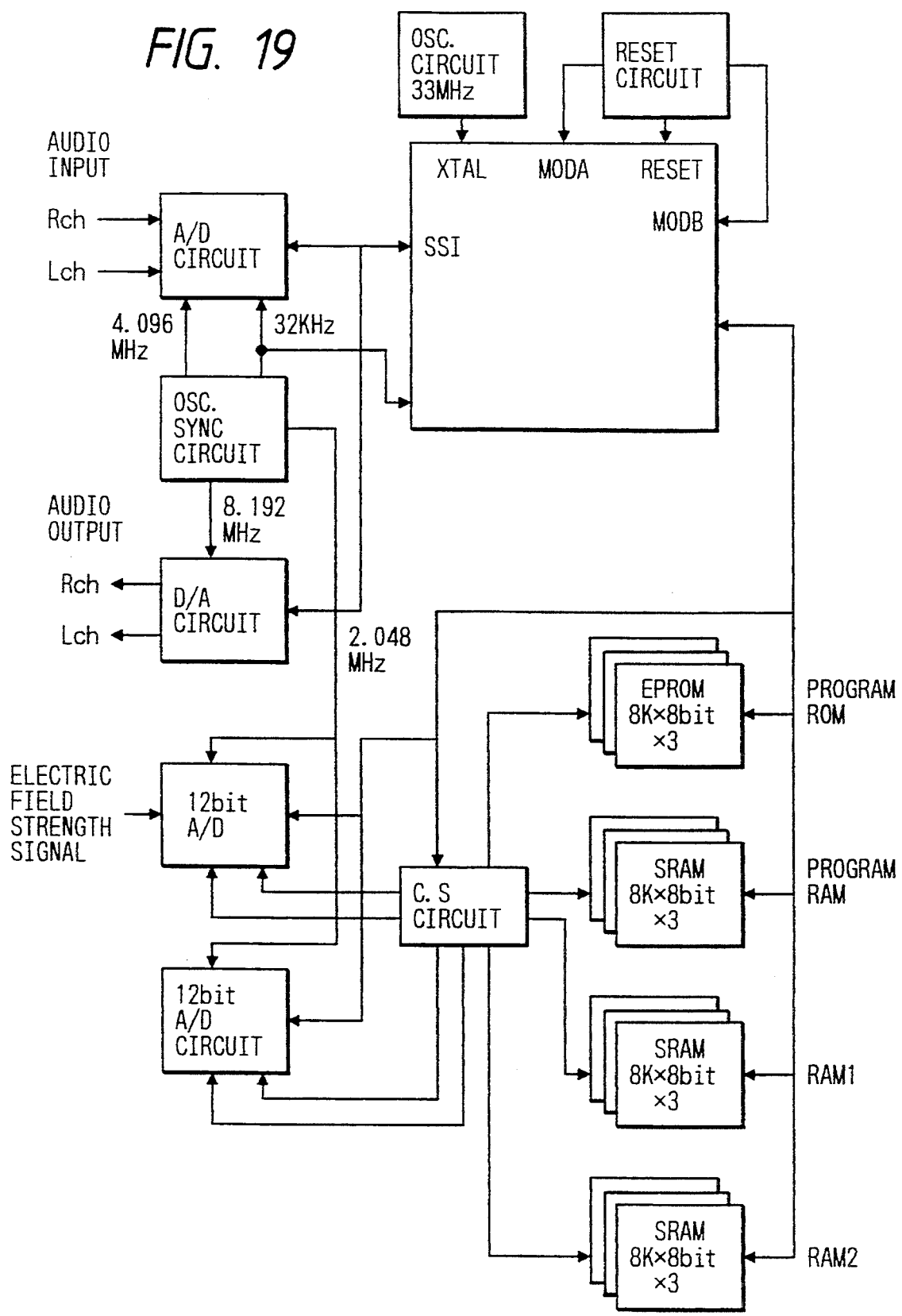
FIG. 19 is a circuit block diagram showing digital components of the embodiment of the present invention.
Figure 20:
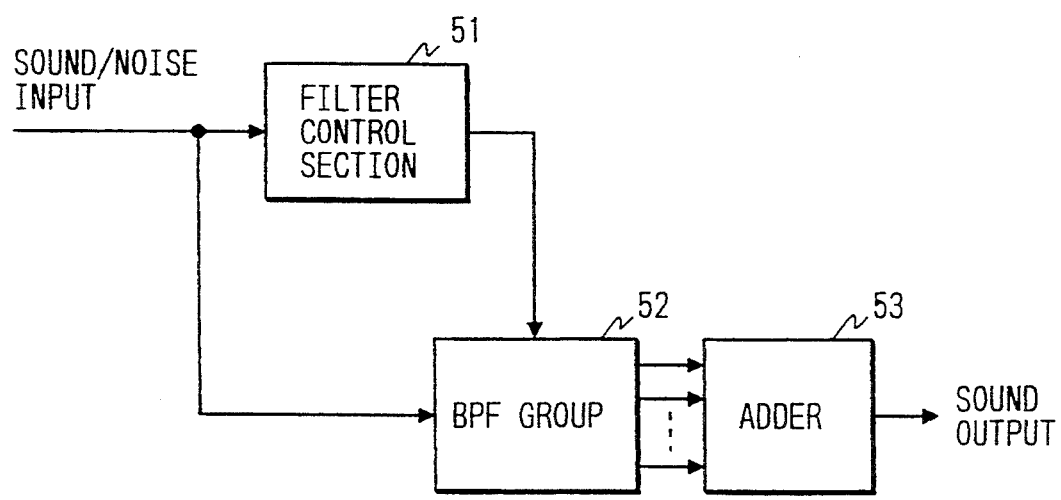
FIG. 20 is a circuit diagram showing a conventional noise suppression apparatus.

FIG. 15(a) shows a System specification used in this embodiment of the present invention, and FIG. 15(b) shows a relationship between the frame length and the frame period. FIG. 16 shows a block diagram of the hardware, and FIG. 17 shows a memory layout. FIGS. 18 shows a data memory map, and FIG. 19 shows a circuit block diagram of the digital components.

As this invention may be embodied in several forms without departing from the spirit of essential characteristics thereof, the present embodiments are therefore illustrative and not restrictive, since the scope of the invention is defined by the appending claims rather than by the description preceding them, and all changes that fall within meets and bounds of the claims, or equivalence of such meets and bounds are therefore intended to embraced by the claims.

What is claimed is:

1. A noise suppression apparatus comprising:
a receiving means for selectively receiving a radio wave signal to be received and transforming it into an electric signal;
a field information detecting means for detecting an electric field information of said radio Wave signal received by said receiving means;
a noise suppression control means for suppressing a noise component contained in said electric signal outputted from said receiving means on the basis of said electric field information detected by said field information detecting means,
wherein said noise suppression control means operates for producing an optimum noise pattern in accordance with the electric field information, said optimum noise pattern being a noise spectrum corresponding to the electric field information detected by said field information detecting means, and said noise suppression control means further operates for subtracting said optimum noise pattern from said electric signal representative of said received radio wave signal in accordance with a clamping factor to prevent excessive noise removal; and
an output means for outputting a noiseless signal outputted from said noise suppression control means.

2. A noise suppression apparatus in accordance with claim 1, wherein said field information detecting means chooses an intermediate-frequency signal from said receiving means, and detects a strength of electric field by analyzing component of this intermediate-frequency signal.

3. A noise suppression apparatus in accordance with claim 2, wherein said strength of electric field is measured by detecting a direct-current component of said intermediate-frequency signal.

4. A noise suppression apparatus in accordance with claim 1, wherein said field information detecting means chooses an intermediate-frequency signal from said receiving means, and detects influence of multipath by analyzing component of this intermediate-frequency signal.

5. A noise suppression apparatus in accordance with claim 4, wherein said influence of the multipath is measured by detecting an amplitude of the intermediate-frequency signal.

6. A noise suppression apparatus comprising:
   a receiving means for selectively receiving a radio wave signal to be received and transforming it into an electric signal;
   a field information detecting means for detecting electric field information of said radio wave signal received by said receiving means;
   a noise data generating means for generating an optimum noise pattern on the basis of said electric field information detected by said field information detecting means, said optimum noise pattern being a noise spectrum corresponding to the electric field information detected by said field information detecting means;
   a noise cancel means for canceling a noise component of said electric signal outputted from said receiving means on the basis of said optimum noise pattern generated by said noise data generating means by subtracting said optimum noise pattern from said electric signal representative of said received radio wave signal in accordance with a clamping factor to prevent excessive noise removal; and
   an output means for outputting a noiseless signal outputted from said noise cancel means.

7. A noise suppression apparatus in accordance with claim 6, wherein said noise data generating means includes a noise pattern memory, which memorizes a plurality of noise patterns.

8. A noise suppression apparatus in accordance with claim 7, wherein said noise data generating means selects an optimum noise pattern among said noise patterns memorized in the noise pattern memory, and feeds thus selected noise pattern to the noise cancel means.

9. A noise suppression apparatus in accordance with claim 6, wherein said noise cancel means includes a cancel factor setting means for setting a cancel factor to each frequency band of said signal outputted from said receiving means.

10. A noise suppression apparatus in accordance with claim 6, wherein said noise data generating means synthesizes a noise pattern corresponding to an electric field strength by linearly obtaining approximation on the basis of a predetermined number of noise patterns memorized in a noise pattern memory.

11. A noise suppression apparatus comprising:
    a receiving means for selectively receiving a radio wave signal to be received and transforming it into an electric signal;
    a field information detecting means for detecting electric field information of said radio wave signal received by said receiving means;
    a noise data generating means for generating a noise pattern on the basis of said electric field information detected by said field information detecting means;
    a noise cancel means for cancelling a noise component of said signal outputted from said receiving means on the basis of said noise pattern generated by said noise data generating means, said noise cancel means including a cancel factor setting means for setting a cancel factor to each frequency band of said signal outputted from said receiving means;
    a clamping factor setting means for generating a clamping factor, used for controlling said cancel factor in noise cancelling operation so as to suppress adverse affection of noise removal; and
    an output means for outputting a noiseless signal outputted from said noise cancel means.

12. A noise suppression apparatus in accordance with claim 11, wherein said noise cancel means includes a masking control means for judging Whether or not said clamping factor should be set by said clamping factor setting means.

13. A noise suppression apparatus in accordance with claim 12, wherein said masking control means detects noise levels of upper and lower frequencies adjacent to a frequency of a noise to be canceled.

14. A noise suppression apparatus in accordance with claim 13, wherein said masking control means prevents said clamping factor from being set when said noise level of said adjacent frequency is larger than a predetermined value.

15. A noise suppression apparatus in accordance with claim 12, wherein said noise cancel means includes a subtraction means for receiving signals from said cancel factor setting means, clamping factor setting means, and masking control means, in,order to subtract a noise component from said signal outputted from said receiving means.

16. A noise suppression apparatus comprising:
    a receiving means for receiving a radio wave signal;
    an A/D converter for converting said radio wave signal from an analog signal into a digital signal;
    a signal transformer for transforming said digital signal into an appropriate signal form;
    a field information detecting means for detecting electric field information of said radio wave signal;
    a noise data generating means for generating an optimum noise pattern on the basis of said electric field information, said optimum noise pattern being a noise spectrum corresponding to the electric field information detected by said field information detecting means;
    a noise cancel means for receiving an output of said signal transformer and an output of said noise data generating means, to cancel a noise component of said signal outputted from said signal transformer on the basis of said optimum noise pattern generated by said noise data generating means by subtracting said output of said noise data generating means from said output of said signal transformer in accordance with a clamping factor to prevent excessive noise removal;

an inverse signal transformer for receiving an output of said noise cancel means and executing an inverse processing of said signal transformer; and a D/A converter for converting an output of said inverse signal transformer into a noiseless analog signal.

17. A noise suppression apparatus in accordance with claim 16, wherein said signal transformer is a fast hartley transformer.

18. A noise suppression apparatus in accordance with claim 17, wherein an output of said fast hartley transformer is calculated by the following equation:

$$H(k) = \sum_{n=0}^{N-1} X(n) \cdot cas(2\pi k/N)$$

$(k = 0, 1, \ldots, N - 1)$
$cas(\theta) = cos(\theta) + sin(\theta).$

19. A noise suppression apparatus in accordance with claim 16, wherein said noise data generating means includes an average circuit for obtaining an average of signals representing electric field strengths, a noise pattern memory for memorizing a plurality of noise patterns, and a noise calculation circuit for receiving an averaged electric field signal from said average circuit and synthesizing a noise signal on the basis of thus obtained average electric field signal and a noise data memorized in said noise pattern memory.

20. A noise suppression apparatus in accordance with claim 16, wherein said noise cancel means obtains a power spectrum on the basis of the output signal of said signal transformer, and executes a noise cancel processing.

21. A noise suppression apparatus in accordance with claim 16, wherein said noise data generating means synthesizes a noise pattern corresponding to an electric field strength by linearly obtaining approximation on the basis of a predetermined number of noise patterns memorized in a noise pattern memory.

22. A noise suppression apparatus comprising:
a receiving means for selectively receiving a radio wave signal to be received and transforming it into an electric signal;
a field information detecting means for detecting electric field information of said radio wave signal received by said receiving means;
a noise data generating means for generating an optimum noise pattern on the basis of said electric field information detected by said field information detecting means, said optimum noise pattern being a noise spectrum corresponding to the electric field information detected by said field information detecting means;
a signal judging means for receives said signal from said receiving means and judging a signal kind of said signal;
a noise cancel means for canceling a noise component of said signal outputted form said receiving means on the basis of said optimum noise pattern generated by said noise data generating means and said signal kind judged by said signal judging means in accordance with clamping factor to prevent excessive noise removal; and
an output means for outputting a noiseless signal outputted from said noise cancel means.

23. A noise suppression apparatus in accordance with claim 22, wherein said signal judging means judges whether content of broadcasting is news or music.

24. A noise suppression apparatus in accordance with claim 23, wherein said noise cancel means suppresses a noise cancel amount when said signal judging means judges the broadcasting is music.

25. A noise suppression apparatus comprising:
a receiving means for selectively receiving a radio wave signal to be received and transforming it into an electric signal;
a field information detecting means for detecting multipath information of said radio wave signal received by said receiving means;
a multipath noise data generating means for generating an optimum multipath noise pattern on the basis of said multipath information detected by said field information detecting means, said optimum multipath noise pattern being a noise spectrum corresponding to the electric field information detected by said field information detecting means;
a noise cancel means for cancelling a multipath noise component of said signal outputted form said receiving means on the basis of said multipath noise pattern generated by said multipath noise data generating means in accordance with a clamping factor to prevent excessive noise removal; and
an output means for outputting a noiseless signal outputted from said noise cancel means.

26. A noise suppression apparatus in accordance with claim 25, wherein said field information detecting means chooses an FM intermediate-frequency signal from said receiving means, and detects the influence of multipath by measuring an amplitude of the FM intermediate-frequency signal.

27. A noise suppression apparatus in accordance with claim 25, wherein said field information detecting means chooses an FM intermediate-frequency signal from said receiving means, and detects the influence of multipath by measuring a frequency of the FM intermediate-frequency signal.

28. A noise suppression apparatus in accordance with claim 25, wherein said multipath noise data generating means constitutes a matrix of multipath signal (Y1, Y2, - - -,Yk, - - - Yn) and said signal outputted from receiving means (X1, X2, X3, - - - , Xk, - - - , Xn), so as to select an optimum multipath noise pattern from this matrix.

29. A noise suppression apparatus in accordance with claim 25, further comprising a noise data generating means for generating a noise pattern on the basis of an electric field 30. A noise suppression apparatus: comprising:
a receiving means for selectively receiving a radio wave signal to be received and transforming it into an electric signal;
a field information detecting means for detecting electric field information of said radio Wave signal received by said receiving means;
a noise data generating means for generating a noise pattern on the basis of said electric field information detected by said field information detecting means;
a noise cancel means for cancelling a noise component of said electric signal outputted from said receiving means on the basis of said noise pattern generated by said noise data generating means; and
an output means for outputting a noiseless signal outputted from said noise cancel means;

wherein:

said noise data generating means includes a noise pattern memory, which memorizes a plurality of noise patterns;

said noise data generating means receives a signal outputted form said receiving means, selects an optimum noise pattern among said noise patterns memorized in the noise pattern memory in accordance with signal outputted form said receiving means, and feeds thus selected noise pattern to the noise cancel means; and said noise cancel means includes a clamping factor so as to suppress adverse affection of noise removal.

31. A noise suppression apparatus comprising:

a receiving means for selectively receiving a radio wave signal to be received and transforming it into an electric signal;

a field information detecting means for detecting electric field information of said radio wave signal received by said receiving means;

a noise data generating means for generating a noise pattern on the basis of said electric field information detected by said field information detecting means;

a noise cancel means for cancelling a noise component of said electric signal outputted from said receiving means on the basis of said noise pattern generated by said noise data generating means; and an output means for ouputting a noiseless signal outputted from said noise cancel means;

wherein:

said noise cancel means includes a cancel factor setting means; and said cancel factor setting means sets a cancel factor to each frequency band of said signal outputted from said receiving means.

* * * * *